United States Patent
Lutz et al.

(10) Patent No.: US 7,362,197 B2
(45) Date of Patent: *Apr. 22, 2008

(54) TEMPERATURE COMPENSATION FOR SILICON MEMS RESONATOR

(75) Inventors: Markus Lutz, Palo Alto, CA (US); Aaron Partridge, Palo Alto, CA (US)

(73) Assignee: Robert Bosch GmbH, Stuttgart (DE)

( * ) Notice: Subject to any disclaimer, the term of this patent is extended or adjusted under 35 U.S.C. 154(b) by 0 days.

This patent is subject to a terminal disclaimer.

(21) Appl. No.: 11/725,878

(22) Filed: Mar. 20, 2007

(65) Prior Publication Data

US 2007/0188269 A1    Aug. 16, 2007

Related U.S. Application Data

(62) Division of application No. 11/405,817, filed on Apr. 18, 2006, now Pat. No. 7,202,761, which is a division of application No. 11/063,794, filed on Feb. 23, 2005, now Pat. No. 7,071,793, which is a division of application No. 10/414,793, filed on Apr. 16, 2003, now Pat. No. 6,987,432.

(51) Int. Cl.
*H03H 9/46* (2006.01)
*H03H 9/52* (2006.01)

(52) U.S. Cl. .................. 333/186; 333/197; 333/200
(58) Field of Classification Search ............. 333/186, 333/197, 200
See application file for complete search history.

(56) References Cited

U.S. PATENT DOCUMENTS

| 6,410,361 | B2 * | 6/2002 | Dhuler et al. ............ 438/54 |
| 6,557,419 | B1 * | 5/2003 | Herb et al. ............... 73/766 |
| 6,667,245 | B2 * | 12/2003 | Chow et al. ............ 438/723 |
| 6,800,503 | B2 * | 10/2004 | Kocis et al. ............ 438/52 |
| 7,068,125 | B2 * | 6/2006 | Lutz et al. .............. 333/186 |
| 7,071,793 | B2 * | 7/2006 | Lutz et al. .............. 333/186 |
| 7,202,761 | B2 * | 4/2007 | Lutz et al. .............. 333/186 |

* cited by examiner

*Primary Examiner*—Barbara Summons
(74) *Attorney, Agent, or Firm*—Kenyon & Kenyon LLP (57) ABSTRACT

Thermally induced frequency variations in a micromechanical resonator are actively or passively mitigated by application of a compensating stiffness, or a compressive/tensile strain. Various composition materials may be selected according to their thermal expansion coefficient and used to form resonator components on a substrate. When exposed to temperature variations, the relative expansion of these composition materials creates a compensating stiffness, or a compressive/tensile strain.

15 Claims, 10 Drawing Sheets

TEMPERATURE COMPENSATION FOR SILICON MEMS RESONATOR

RELATED APPLICATION

This application is a divisional application of U.S. patent application Ser. No. 11/405,817 (now U.S. Pat. No. 7,202,761), filed Apr. 18, 2006, which is a divisional application of U.S. patent application Ser. No. 11/063,794 (now U.S. Pat. No. 7,071,793), filed Feb. 23, 2005, which is a divisional application of U.S. patent application Ser. No. 10/414,793 (now U.S. Pat. No. 6,987,432), filed Apr. 16, 2003, the contents of which are incorporated herein by reference.

BACKGROUND

The present invention relates generally to microelectromechanical systems (MEMS). MEMS are devices formed from miniaturized components operatively arranged on a substrate. These components are constructed through the use of lithographic and other micro-fabrication technologies to yield, for example, sensors and actuators.

Many common micromechanical structures are based on the reaction (e.g., oscillation, deflection or torsion) of a beam structure to an applied force. Such beam structures usually have, or are modeled to have, a rectangular cross section. However, the degree to which a beam is actually "rectangular" depends on the anisotropy of the etching method used to form it. Beams are used in the suspension of rigid plates, as lateral oscillators, or as cantilever devices. They are a natural choice for bearing-less motion detectors. Of particular note, MEMS increasingly use beams within resonator structures as part of clock and signal filtering circuits.

Single crystal semiconductors, such as silicon, are the obvious material of choice for the fabrication of resonator beams. Such materials have excellent mechanical strength and high intrinsic quality factor. Furthermore, the formation and processing of silicon-based materials are well-developed fields of endeavor drawing upon decades of experience from the integrated circuit industry.

Using polycrystalline silicon ("Poly Si"), for example, one may design resonators having great flexibility in geometry. However, the simple, but commonly used, bending beam and lateral oscillating beam structures will serve to illustrate not only some of the performance concerns associated with conventional resonators, but also the precepts of the present invention that follow.

Figure 1:
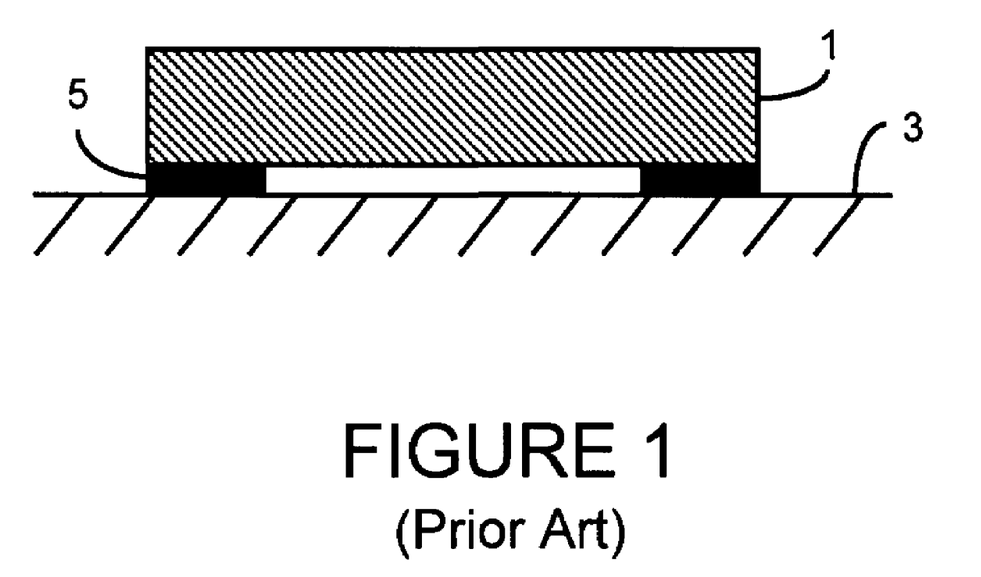
FIG. 1 illustrates a conventional bending beam structure.

Looking at FIG. 1, a bending beam structure is formed by suspending a length of beam 1 having a rectangular cross section above a semiconductor substrate 3 by means of end anchors 5. Typically, an actuating electrode (not shown) is associated with the beam, i.e., placed in electrostatic field proximity to the beam. The beam is excited by an electrostatic field induced by the electrode and mechanically vibrates in sympathy with oscillations in the electrostatic field.

When a force is applied to the surface of a beam, that surface is said to be stressed. The average value of this stress, σ, may be expressed as the loading force, F, divided by the area, A, over which it is applied, or:

$$\sigma = \frac{F}{A}$$

When subjected to a stress, materials literally get pushed (or pulled) out of shape. Strain, ε, is a measure of this deformation, within the elastic limits of the material, and equals the change in length, ΔL, divided by the original length, $L_O$, or:

$$\varepsilon = \frac{\Delta L}{L_o}$$

Most materials of interest deform linearly with load. Since load is proportional to stress and deformation is proportional to strain, stress and strain are linearly related. The proportionality constant that relates these two measures is known as the elastic modulus or Young's modulus for the material and is given the symbol "E." Young's module are known for a great range of materials.

The mechanical stiffness, $k_M$, of a beam, as calculated with respect to the oscillation direction parallel to the width of the beam "w," is proportional to its Young's modulus, E, and certain measures of its geometry, including for a beam with a rectangular cross section; length, "L," and height, "h."

$$k_M \approx \frac{E \cdot h \cdot w^3}{L^3} \qquad \text{EQUATION 1}$$

As is well understood, the Young's modulus for most materials of interest changes with temperature according to known thermal coefficients ($\alpha_E$). For example, Poly Si has a thermal coefficient of 30 ppm/K°. Furthermore, the geometry of a beam structure also changes with temperature, generally expanding with increasing in temperature. Again, as an example, Poly Si has a thermal expansion coefficient, $\alpha_{exp}$, of 2.5 ppm/K°.

For some beam designs and related modeling purposes, and given a material with an isotropic thermal coefficient, the effect of thermal expansion on the width of the beam is essentially offset by the effect of thermal expansion on the length of the beam, thus resulting in a remaining linear effect on the height of the beam.

Setting aside electrostatic forces, the resonance frequency (f) of a beam may thus be defined under these assumptions by the equation:

$$f \approx \frac{1}{2 \cdot \pi} \cdot \sqrt{\frac{k_M}{m_{eff}}} \qquad \text{EQUATION 2}$$

where $m_{eff}$ is the effective mass of the beam, constant over temperature.

Given the critical nature of a beam's resonance frequency to the overall performance of the resonator, it must remain relatively stable over a range of operating temperatures. In view of the relationship set forth in EQUATION 2, frequency will remain constant only if the mechanical stiffness remains constant. This, however, will not normally be the case as thermally induced changes to the Young's modulus tend to change in the mechanical stiffness of the beam. Accordingly, some external influence is required to "compensate" for the inevitable changes in resonance frequency due to variations in temperature.

Prior attempts have been made to address the issue of resonant beam frequency stabilization in the presence of changing temperature. See, for example, Wan-Thai Hsu, Stiffness-Compensated Temperature Insensitive Micromechanical Resonators, MEMS 2002 (-7803-7185-2/02 IEEE). Such attempts have, however, focused on the issue of vertical oscillation compensation and have prescribing the remedial use of gold or similar materials that are incompatible with CMOS integration.

For other beam designs and related modeling purposes, the frequency (f) of a resonance beam having a rectangular cross section may be expressed by the following equation:

$$f \approx \frac{t}{L^2}\sqrt{\frac{E}{\rho}\left(1+\frac{L^2}{7t^2}S\right)} \quad \text{EQUATION 3}$$

where "$\rho$" is the density of the material forming the beam, and "S" is an elastic strain applied to the beam.

As temperature rises, both L and t increase due to thermal expansion, but the effect of the changes in L dominate due to the fact that L is much, much greater than t. As a result, the frequency tends to decrease as temperature increases, and vice versa. Also apparent from the foregoing equation, compressive strain applied to the beam with increasing temperature will enhance frequency sensitivity as a function of temperature. Conversely, tensile strain applied to the beam with increasing temperature will retard frequency sensitivity as a function of temperature. Such conditions can be better understood by first assuming a desired relationship wherein the change in frequency, d(f) as a function of the change in temperature, d(T) is equal to 0. Substituting and equating expressions yields:

$$\alpha_{exp}\left(1+\frac{L^2}{7t^2}S\right) = \frac{L^2}{7t^2}\frac{dS}{dT} \quad \text{EQUATION 4}$$

For most practical situations, the applied strain, S, will be much, much less than one. Under such assumptions, the relationship described in EQUATION 4 becomes:

$$\frac{dS}{dT} = \frac{7t^2}{L^2}\alpha_{exp} \quad \text{EQUATION 5}$$

It is again apparent from this relationship that thermally induced changes to the resonant frequency of a beam may be retarded (i.e., compensated for) or enhanced by changes in an elastic strain, (d(S)), applied to the beam.

Unfortunately, the thermal coefficient of Young's modulus for silicon is in the order of 30 ppm/K. This reality leads to considerable temperature drift in the frequency of an oscillating beam in the range of 18 ppm/C°. Given nominal requirements for temperature stabilities ranging from 0.1 to 50 ppm, and common operating temperature specifications ranging from −40C.° to +85C.°, the putative MEMS designer faces a considerable challenge in the design of a temperature stable resonator.

Clearly, an efficient compensation mechanism is required for frequency stability of micromechanical resonators over an operating temperature range. Such a mechanism should not rely on the incorporation of materials incompatible with CMOS integrations.

SUMMARY OF THE INVENTIONS

The present invention addresses the issues of temperature compensation for micromechanical resonators. Both active and passive solutions are presented. Indeed, employing both active and passive techniques in the same solution is also presented. Active solutions are characterized by the application of an external influence on the resonator from a circuit or mechanism external to the resonator structure itself. Passive solutions draw upon the inherent and disparate thermal expansion qualities found in the semiconductor materials selected to form the resonator structure.

In a first aspect, the present invention provides an active method of compensating for thermally induced frequency variations in a micromechanical resonator including an oscillating beam and an electrode. The method includes determining the actual operating frequency for the beam in relation to a desired resonance frequency, and thereafter applying a compensating stiffness to the resonator to maintain the desired resonance frequency. In one related embodiment, the compensating stiffness is provided by an electrostatic force applied to the beam by the electrode.

Within certain active, compensation solutions, the frequency for a resonator may be determined using a feedback circuit that either directly detects actual operating frequency, or that detects the operating temperature of the resonator. In response to a corresponding output signal from the feedback circuit, a voltage applied to the electrode may be varied to provide a compensating, electrostatic stiffness on the oscillating beam.

In an alternative set of active, compensation solutions, a working gap between the oscillating beam and the electrode is adjusted to vary the compensating stiffness applied to the beam.

However, other aspects of the present invention are readily applicable to passive approaches to frequency stabilization of a resonator over an operating temperature range. For example, one method of fabricating a micromechanical resonator according to the present invention forms a beam structure and/or related support structure(s) from a first material, and the electrode, at least in part, from a second material. Where the first and second materials are properly selected with disparate thermal expansion coefficients, the relative expansion of these components with temperature will tend to passively adjust the working gap between the beam and electrode to vary a compensating stiffness applied to the beam, such that resonator frequency remains substantially stable over a prescribed temperature range.

There are myriad ways to form an electrode having an effective thermal expansion coefficient that differs from the substrate, the beam, and/or the support structures for the beam. Lever arms may be used to magnify the effects of disparate thermal expansion. In one related embodiment, an electrode and beam are formed from an active layer deposited on a semiconductor substrate. The active layer has a first thermal expansion coefficient. Thereafter, the body of the electrode is modified to incorporate a second material having a different thermal expansion coefficient. Within this and similar embodiments, the first and/or second materials may be conveniently selected from a group of possible materials including; silicon, poly-silicon, Epi-Poly, LPCVD-Poly, silicon dioxide, germanium, silicon-germanium compounds, silicon nitrides, and silicon carbide.

In yet another set of passive compensation solutions, a micromechanical resonator is formed on a substrate of first material type. An oscillating beam, related support structure(s), and/or an electrode are thereafter formed from an active layer of second material type. Anchors for the support structure(s) and the electrode may be placed at different lateral positions on the substrate, such that relative thermal expansion of these components on the substrate will tend to adjust a working gap between the beam and the electrode to thereby compensate for frequency variations in the beam's oscillations over temperature.

In another closely related aspect, the present invention provides a micromechanical resonator, suspended over a substrate by means of an anchor. At one point, the anchor fixes the beam to the substrate, but the anchor also includes a composite structure formed from two or more materials having different thermal expansion coefficients. Where the materials used to form the anchor are properly selected in relation to the material used to form the substrate, relative thermal expansion between these materials may be used to apply a compressive or tensile strain on the beam. An appropriate strain upon the beam tends to compensate for thermally induced frequency variations. Lever arms may be incorporated into a resonator design to amplify the compressive or tensile strain applied to the beam.

BRIEF DESCRIPTION OF THE DRAWINGS

In the course of the detailed description to follow, reference will be made to the attached drawings. These drawings show different aspects of the present invention and, where appropriate, reference numerals illustrating like structures, components, materials and/or elements in different figures are labeled similarly. It is understood that various combinations of the structures, components, materials and/or elements, other than those specifically shown, are contemplated and are within the scope of the present invention.

DETAILED DESCRIPTION

The description that follows presents several design possibilities, methods, and/or mechanical structures in surface micromachining, whereby thermally induced frequency changes in a micromechanical resonator may be remedied. According to the present invention, semiconductor compatible materials are highly preferred in the fabrication of such resonators.

Throughout the description that follows, semiconductor compatible materials are presumed in the teaching examples. This materials bias is understandable given the contemporary emphasis in CMOS integration of micromechanical structures. However, materials incompatible with such designs may also be used, albeit with fewer current design advantages. Compatible materials are not limited to silicon or silicon-based compositions, but include all materials capable of being fabricated by conventional integrated circuit techniques and/or integrated upon a semiconductor substrate. As presently preferred, resonators according to the present invention may be discrete or readily integrated into larger MEMS devices and/or devices including integrated circuits (for example, CMOS circuitry).

In effect, the present invention eliminates the temperature coefficient of the Young's modulus for the material(s) from which a resonator is formed. The term "resonator" encompasses all structures having, or capable of having, a desired mechanical or electro-mechanical vibration. In the examples that follow, resonators are formed from beam structures having presumptively rectangular cross sections. This assumption derives from the obvious fact that explanations drawn to a resonant beam having a rectangular cross sections are more easily understood than non-rectangular beam structures. The present invention is not, however, limited to resonant beams having rectangular cross sections.

As discussed above, the frequency of a resonator is known to vary (or drift) in relation to temperature. Thus, some compensation mechanism is required to hold the resonator "on frequency" under the influence of a variable operating temperature. Thermal compensation is preferably provided by means of design geometry, rather than process parameters. Furthermore, passive (or inherent) thermal compensation is preferred over active control accomplished by an external circuit. Yet, the present invention is also applicable to active thermal compensation solutions.

Several presently preferred embodiments of the invention are described below. These embodiments are examples teaching the use and making of the invention. They are, however, only examples and do not fully circumscribe the bounds of the present invention which is defined by the claims that follow.

Recall from EQUATION 2 above that the frequency of a resonator, absent the effect of electrostatic forces, may be defined in relation to its mechanical stiffness, $k_M$. In order to maintain a constant frequency, independent of temperature, it is necessary to compensate for the inevitable variations in the frequency of the resonator.

In one aspect of the present invention, a compensating stiffness is applied to the resonator to counteract thermally induced frequency changes. The term "compensating stiffness" broadly denotes any remedial force applied to the resonator. Unlike mechanical stiffness, which derives from the internal composition of the resonator, compensating stiffness results from an external force applied to the physical form of the resonator.

For example, an electrostatic force may be used as a compensating stiffness in the resonator. The electrostatic force, $F_{el}$, between an electrode and an oscillating beam may be expressed as:

$$F_{el} = \frac{1}{2} \cdot \varepsilon \cdot \frac{A}{(d-x)^2} U^2 \qquad \text{EQUATION 6}$$

where $\varepsilon$ is the dielectric constant, A is the area between the beam and electrode, d is the gap between the beam and the electrode, x is the deflection due to oscillation, and U is the applied voltage.

Where the deflection due to oscillation is negligible, the compensating electrostatic stiffness may be expressed as:

$$k_{el} = \frac{dF_{el}}{dx} = \varepsilon \cdot A \cdot \frac{1}{d^3} U^2 \qquad \text{EQUATION 7}$$

Expressed in terms of EQUATION 2 above, the frequency of a resonator as defined by its mechanical stiffness and an externally applied electrostatic stiffness may be expressed as:

$$f = \frac{1}{2 \cdot \pi} \cdot \sqrt{\frac{k_M - k_{el}}{m}} \qquad \text{EQUATION 8}$$

Looking at EQUATIONS 7 and 8, it is apparent that temperature induced variations in the mechanical stiffness, and thus the resonance frequency, may be offset or compensated for by an equal variation in the electrostatic stiffness. Given fixed values for the dielectric constant and the field area, changes in the compensating electrostatic stiffness may be effected by changing the applied voltage U or by changing in the working gap between the beam and the electrode.

Thus, broadly characterized within an active compensation method, one aspect of the present invention may be summarized as (1) determining an actual operating frequency for the resonator, and (2) applying, as needed, a compensating stiffness to the beam, such that a desired resonance frequency is maintained over an operating temperature range. The step of determining the actual operating temperature may be accomplished by any one of a number of conventional feedback circuits directly measuring resonator frequency, or indirectly determining the operating frequency in relation to another measured parameter, such as temperature. In many instances, such data may already exist within the contemplated use of the resonator and may be advantageously used for the purpose of resonator temperature compensation.

Figure 2A:
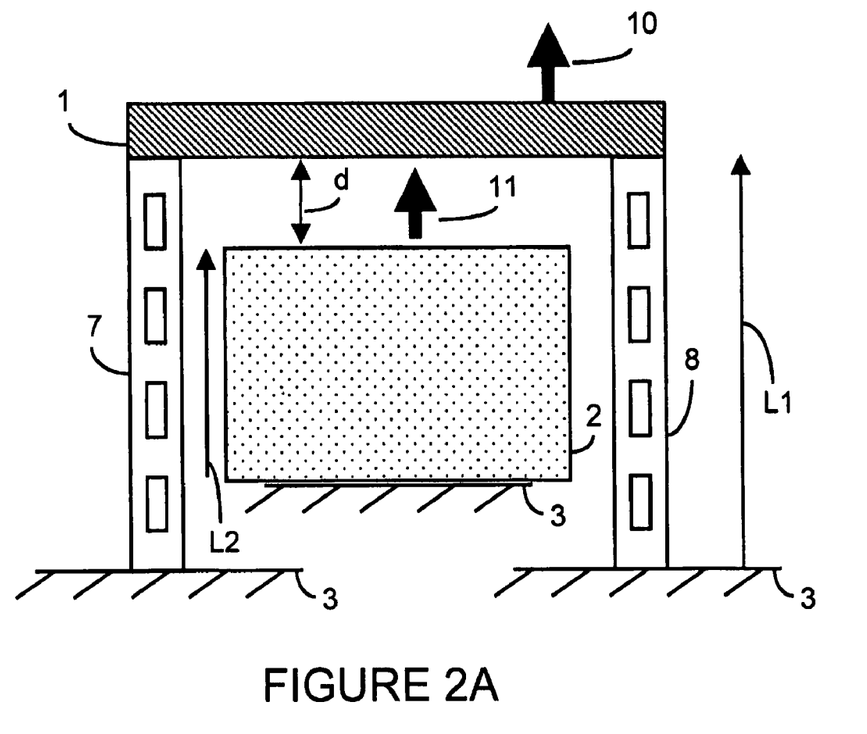
FIGS. 2A and 2B are top views of exemplary micromechanical resonators including a lateral oscillating beam according to the present invention.
Figure 2B:
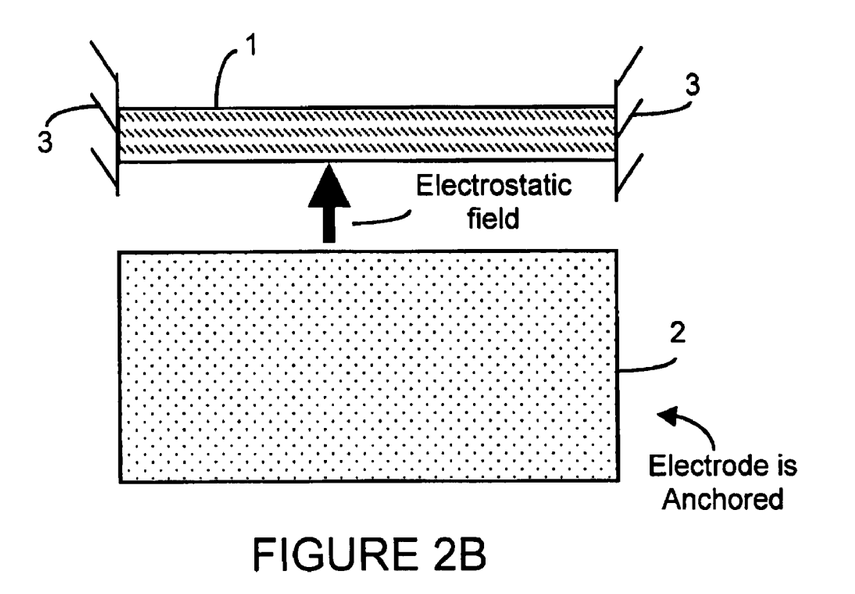

This concept can be better understood by considering the example illustrated in FIGS. 2A and 2B. An oscillating beam 1 is supported in FIG. 2A at opposite ends by support structures 7 and 8 being fixed to substrate 3 and having a height of L1. An electrode 2 having height L2 is also formed on substrate 3 proximate beam 1 and exerting an electrostatic force on beam 1 across working gap d (FIGS. 2A and 2B).

It should be noted that the term "height" is an arbitrary designation in relation to the rectangular example illustrated by the top view shown in FIGS. 2A and 2B, and merely serves to define an axis of orthogonal orientation different from the "length" and "width" of the resonator.

The support structures 7 and 8, electrode 2, and resonator 1 are preferably all formed from CMOS compatible, silicon-based material. These components may be formed from an active layer deposited on a semiconductor substrate, or from separately deposited layers. The term "deposited' merely describes the placement of an active layer on the substrate. It is not process or fabrication technique specific.

Support structures 7 and 8, electrode 2, and beam 1 will expand (and contract) in accordance with the thermal expansion coefficient for their material(s) of their composition. For example, support structures 7 and 8 are assumed to expand away from the point at which they are fixed to the substrate, i.e., in the direction of vector 10 shown in FIG. 2A. Electrode 2 is assumed to expand in the direction of vector 11. While thermal expansion vectors 10 and 11 are shown to be directionally coincident in the example of FIG. 2A, this need not always be the case. However, even where the expansion vectors for these components is in the same direction, the magnitude of expansion may be controlled by the careful selection (or alteration) of the composition materials.

Within the context of the working example, the following parameters may be manipulated during design to achieve temperature compensation during operation of the resonator: (a) the ratio between support structure height L1 and electrode height L2; (b) the ratio between a (first) thermal expansion coefficient for material used to implement the support structures 7 and 8, and a (second) thermal expansion coefficient for material used to implement the electrode 2; and, (c) the distance across the working gap. Additionally, the applied voltage U may be varied in relation to temperature during resonator operation to compensate for temperature induced changes in frequency. Naturally, different resonator geometries will yield different parameters and inter-component relationships that may be manipulated to effect thermal frequency compensation.

In addition to the active compensation solutions discussed, parameters (a) through (c) above may be passively adjusted during operation by, for example, a careful selection of disparate composition materials used to respectively implement the support structures and the electrode. The term "passive" (or passively) as used here refers to a process, method, or adaptation wherein one or more parameters are changed under the influence of changes (e.g., thermal expansion) to one or more components internal to the design. Passive adjustments are distinct from "active" adjustments that require the application of an externally derived force or influence.

Returning to the relationship between frequency, mechanical stiffness, $k_M$, and the compensating electrostatic stiffness $k_{el}$ described in EQUATION 8, it is clear that any increase in $k_M$ must be matched by an equivalent (or nearly equivalent) increase in $k_{el}$ in order for frequency f to remain stable. As noted in EQUATION 1, the mechanical stiffness, $k_M$, for a resonator formed from a silicon based material will increase in relation to an increase in its Young's modulus, E. In order to offset this increase in $k_M$, and an increased $k_{el}$ must be derived.

Looking again at EQUATION 7 and assuming a fixed dielectric constant, $\varepsilon$, and field area, A, $k_{el}$ may be increased by increasing the applied voltage, U, and/or by reducing the working gap, d, between the resonator and the electrode. Increasing applied voltage U is a simple, active solution. A conventional feedback circuit (shown in block diagram form in FIGS. 2A and 2B) may be implemented in relation to the resonator. On the basis of a detected temperature feedback circuit, applied voltage U may be adjusted to compensate for any reasonable variance in temperature.

Figure 3:
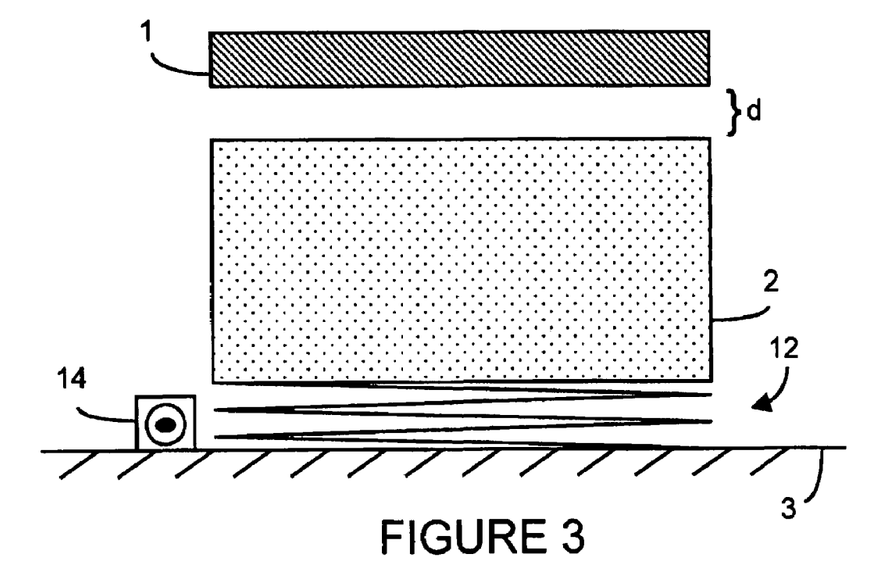
FIG. 3 illustrates an extension mechanism adapted to adjust the working gap shown in FIG. 2B within one exemplary aspect of the present invention.

FIGS. 2A and 2B assume an electrode 2 fixed to substrate 3. If, however, the electrode is moveable with respect to beam 1, then the working gap may be decreased (or increased) in an active, controlled manner using a feedback circuit detecting the temperature or the actual operating frequency of the resonator. As shown in FIG. 3, an extension mechanism 12, such as a tension spring, a rigid support member, or a thermal actuator (for example, an actuator heating the beam/lever arm structure via an applied current), may be used to connect electrode 2 with substrate 3. The extension mechanism 12 may be electrically or mechanically motivated by an associated actuation driver 14. Using any one of these exemplary, or similar, mechanisms, the working gap between electrode 2 and beam 1 may be adjusted in response to an increase in operating temperature, thereby increasing (or decreasing as appropriate) the electrostatic stiffness applied to beam 1 by electrode 2. By careful comparison of thermal expansion coefficients and calculation of a range of electrostatic stiffness over an expected operating temperature range, one may actively mitigate the effects of temperature change on resonator frequency.

Active temperature compensation is attractive in its ability to adapt real-time to temperature variations. However, active compensation schemes come at the price of some significant additional overhead in the form of actuation drivers and/or extension mechanisms. Thus, in many applications a passive temperature compensation solution is desirable.

Figure 4A:
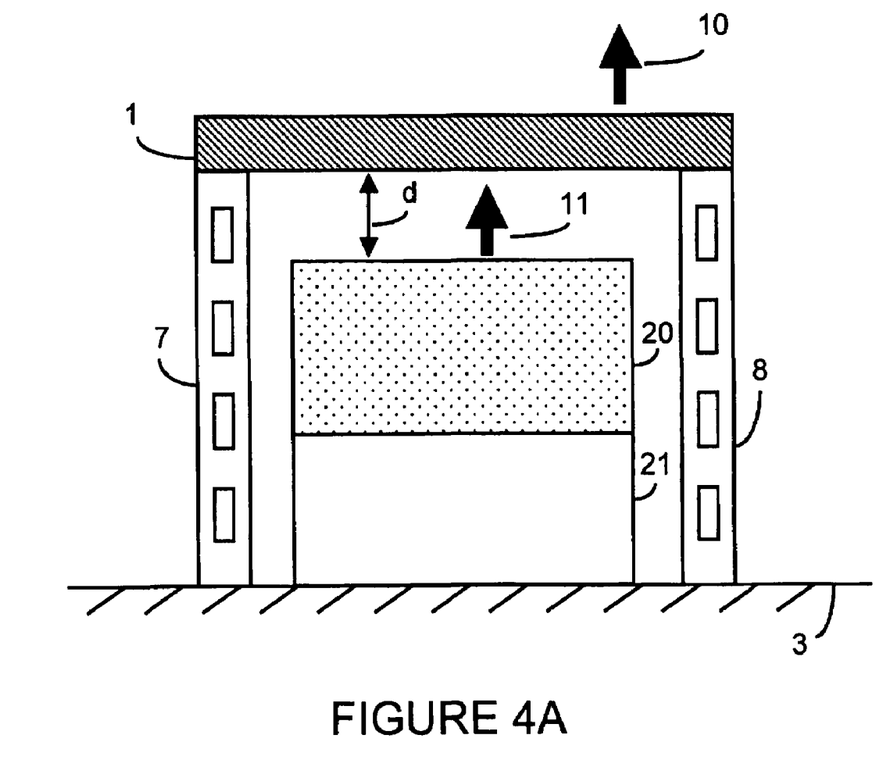
FIGS. 4A, 4B, 5, and 6 illustrate exemplary composite electrodes adapted for use with in the context of the present invention.

FIG. 4A illustrates another example of a passive temperature compensation. In FIG. 4A, the extension mechanism and/or actuation driver of FIG. 3 is/are replaced by a pedestal 21 connecting electrode 20 to substrate 3. By careful selection of composition material for pedestal 21 and electrode 20, relation to the composition material used to form support structures 7 and 8, one may adjust the working gap between the beam and electrode by the calculated, relative effect of thermal expansion on materials having different thermal expansion coefficients.

Figure 4B:
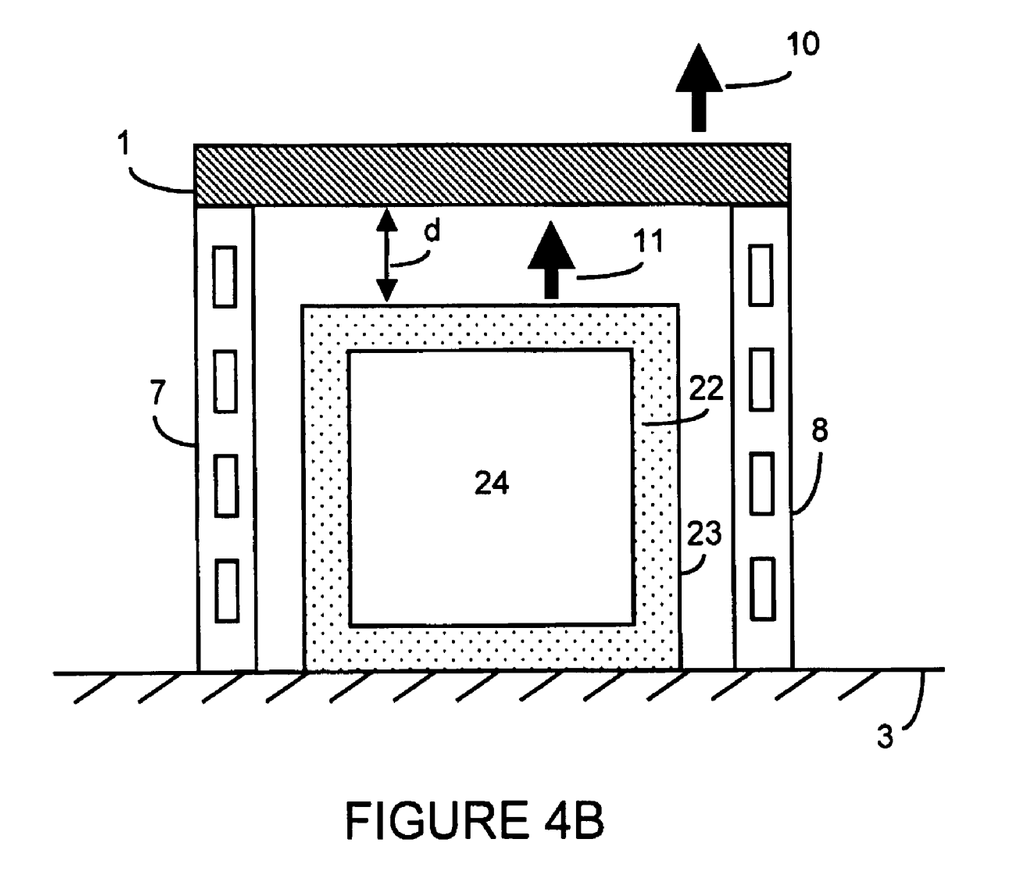

In similar vein, the example illustrated in FIG. 4B comprises an electrode 22 formed from two (or more) composition materials 23 and 24 having disparate thermal expansion coefficients. The actual choice of composition materials is quite broad, including, as examples, poly-silicon (LPCVD-Poly, Epi-Poly, etc.), single crystalline silicon using SOI wafers, silicon germanium having multiple Si/Ge ratios, silicon oxides (e.g., $SiO_2$), silicon nitrides (e.g., $Si_3N_4$), and silicon carbide (SiC) of various types.

In the example shown in FIG. 4B, electrode 22 may be formed from a EpiPoly body 23 having been centrally hallowed out, refilled with $SiO_2$, 24, and recapped by EpiPoly. Since $SiO_2$ has a significantly lower thermal expansion coefficient (0.5 ppm verses 2.5 ppm for EpiPoly), the introduction of $SiO_2$ into the body of electrode 22 will reduce the overall thermal expansion coefficient of electrode 22. In this example, an outer shell of EpiPoly is required since the electrode must be surface conductive. Given the relative difficulty of forming thick $SiO_2$ layers without cracks, electrode 22 is preferably formed using narrowly vacated (e.g., etched) trenches subsequently re-filled with $SiO_2$, or by depositing multiple layers of $SiO_2$ within a vacated cavity in the EpiPoly electrode body.

Figure 5:
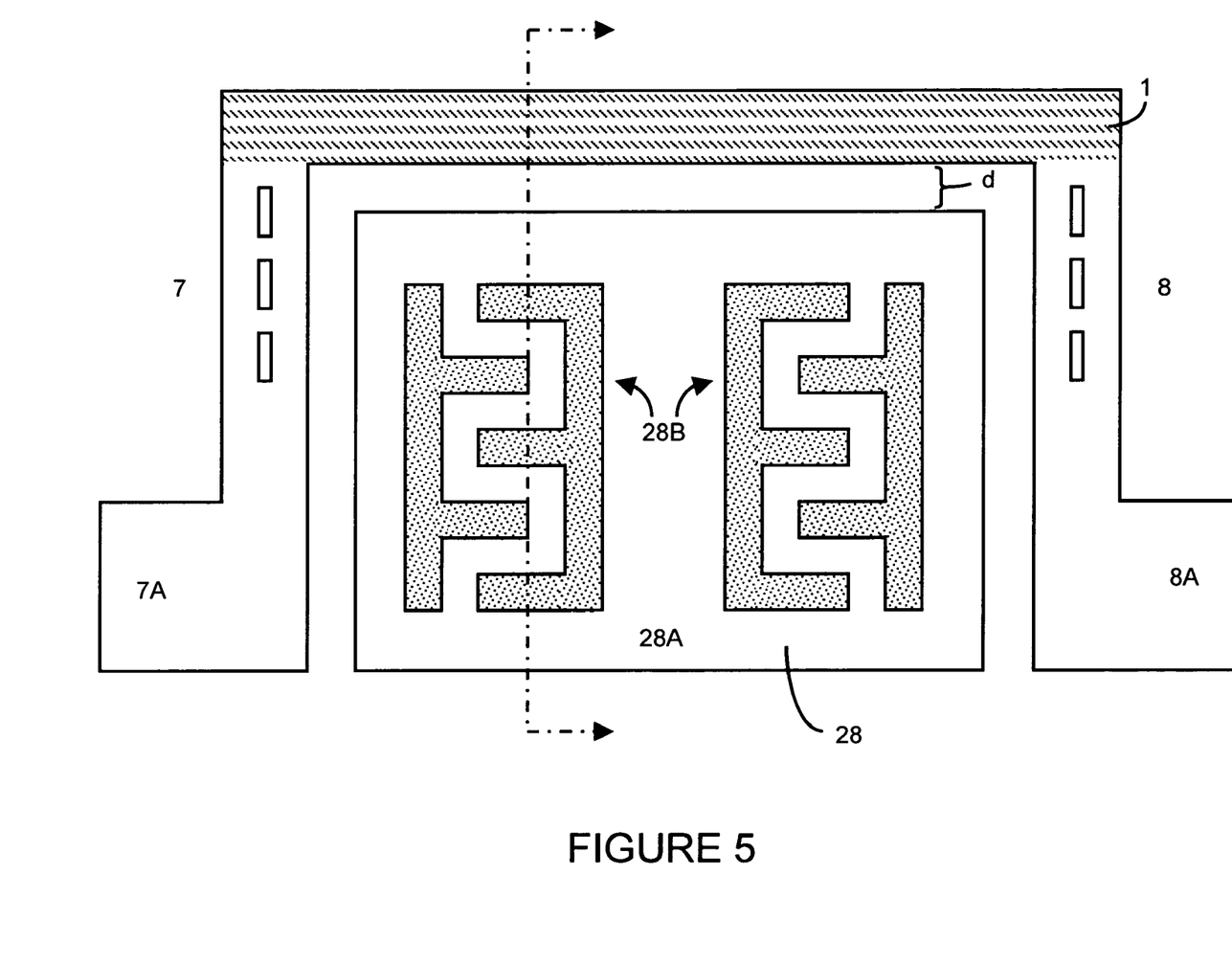

In the related example shown in FIG. 5, a lateral oscillating beam 1 is fixed on either end by respective supports 7 and 8 attached to substrate anchors 7A and 8A. Electrode 28 is fixed to the substrate by anchor 28A. In this example, it is assumed that beam 1, supports 7 and 8, support anchors 7A and 8A are formed from an EpiPoly layer deposited on the substrate. Electrode 28 is also formed from EpiPoly, but portions of the electrode are vacated (e.g., removed by one or more conventional etching processes), and then refilled with a second material 28B, for example $SiO_2$. Assuming the second material is in fact $SiO_2$, the resulting electrode 28 will have a relatively lower thermal expansion coefficient as compared with the components formed from EpiPoly (e.g., the beam, supports, and anchors). Electrode 28 will have a relatively higher thermal expansion coefficient if the second (refill) material were selected from a group of materials having a thermal expansion coefficient higher than EpiPoly. For example, germanium has a thermal expansion coefficient of 4.5 ppm. The grid shaped, vacated portions of the electrode work well for $SiO_2$ refill, but are only one structural example of an electrode having a carefully manipulated thermal expansion coefficient.

Figure 6:
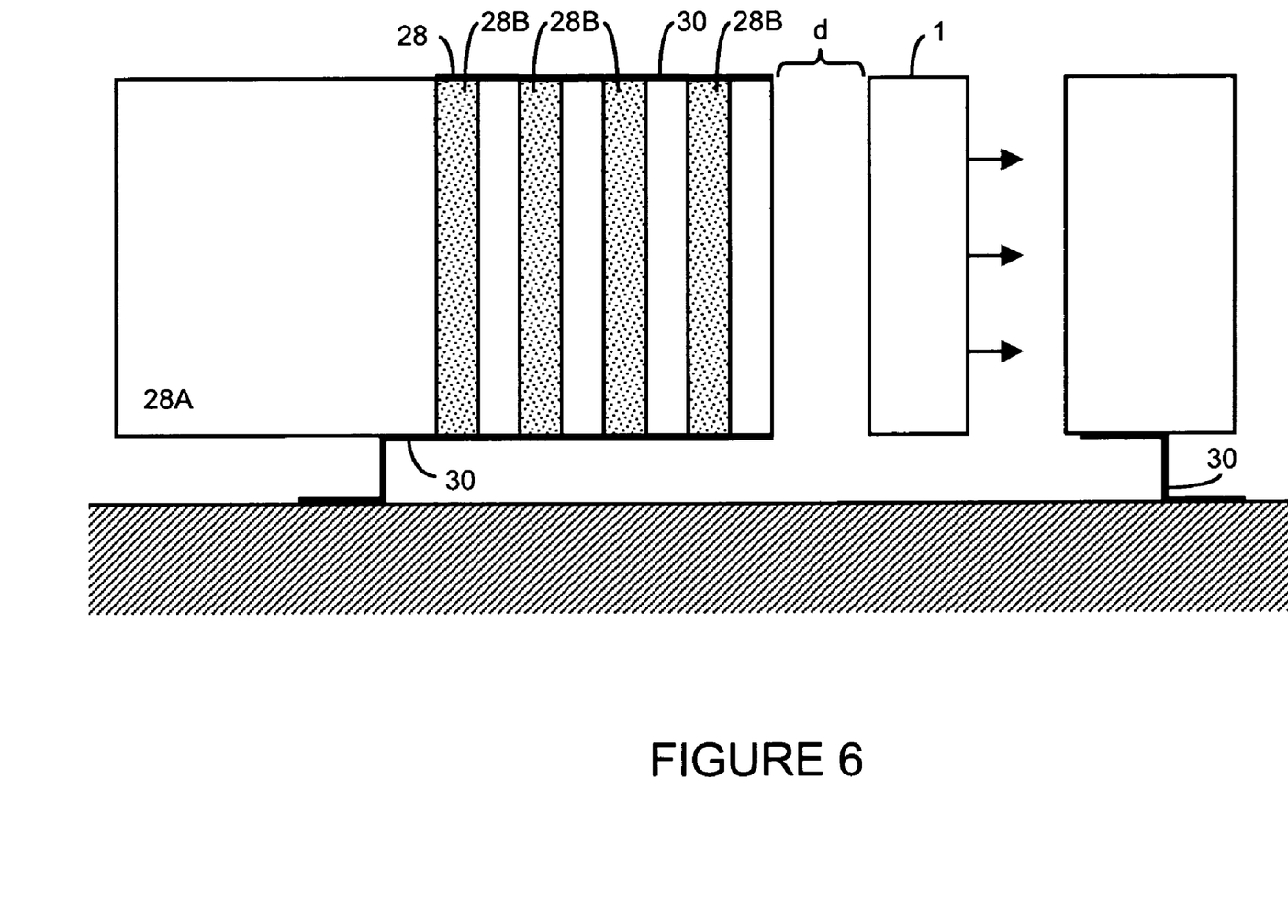

FIG. 6 is a cross section view of the resonator structure shown in FIG. 5. Where an $SiO_2$ is the desired refill material, it must be protected from HF-release of the active structure by means of, for example, a silicon nitride layer 30.

The foregoing examples have described electrode structures formed from at least one additional (secondary) material having a thermal expansion coefficient different from the thermal expansion coefficient of a (first) primary material forming the other associated components in a resonator structure. However, the present invention also contemplates similar alteration of the support structures, the anchors, and/or the beam in similar manner. It is not necessary that any one of these components be formed from a combination of materials, refilled or otherwise combined. Rather, materials having disparate thermal expansion coefficients may be used to form respective components in a resonator. For example, the beam, support structures, and anchors could be formed from EpiPoly and the electrode from germanium.

Figure 7:
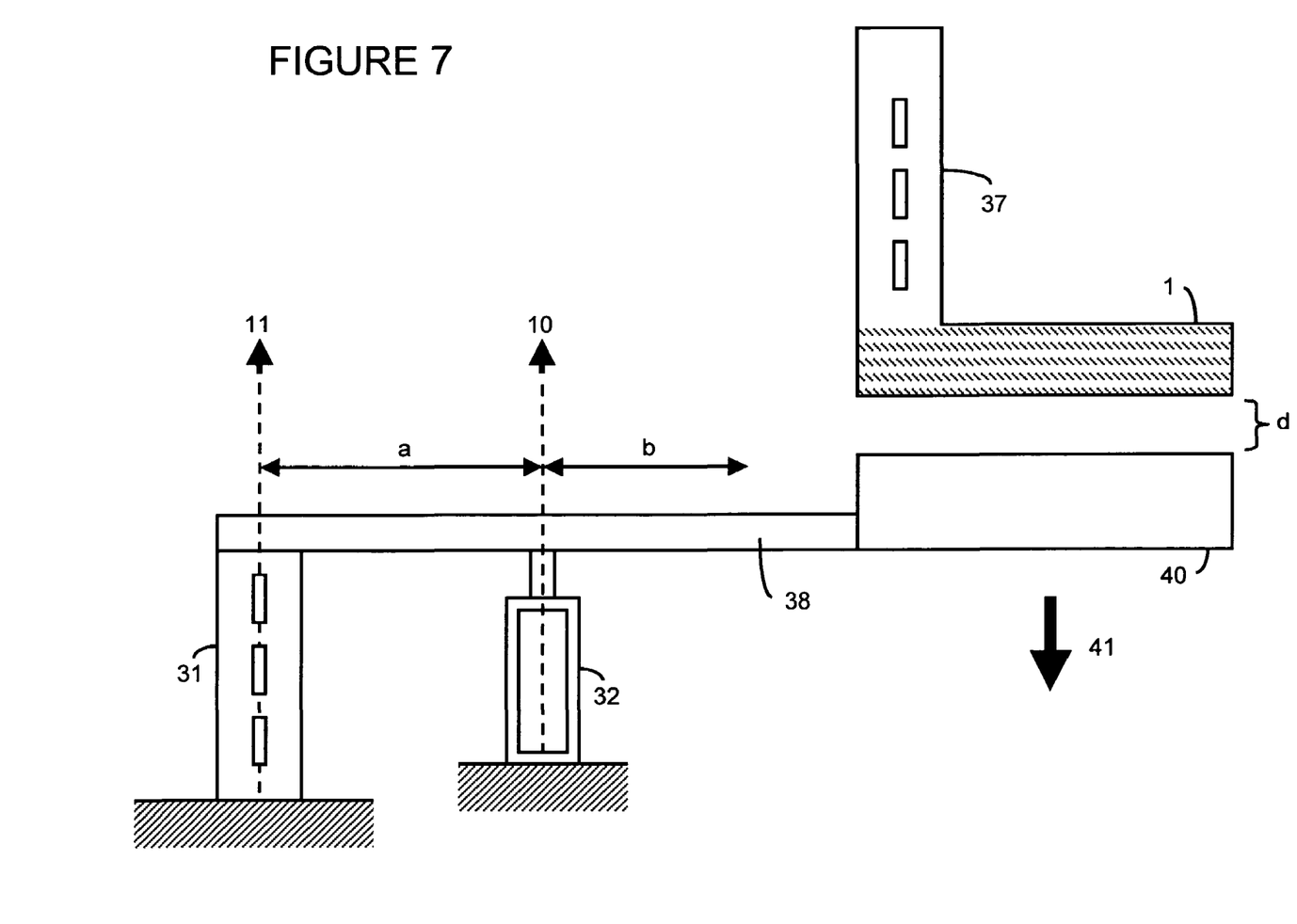
FIG. 7 illustrates the further incorporation and use of lever arm within another exemplary aspect of the present invention.

Additionally, the direction and magnitude of relative component expansion to effect working gap adjustment may be amplified by the use of one or more lever arms. FIG. 7 illustrates one example of such use. A lever arm 38 is moved to adjust the working gap between electrode 40 and beam 1. The movement direction of lever arm 38 is controlled by the difference in thermal expansion (vectors 10 and 11) between a first support 31 and a second support 32, where second support 32 as a fulcrum to lever arm 38. The magnitude of this movement is controlled by the difference in thermal expansion and by the ratio of length a (a first length) and length b (a second length) along the lever arm.

Figure 8:
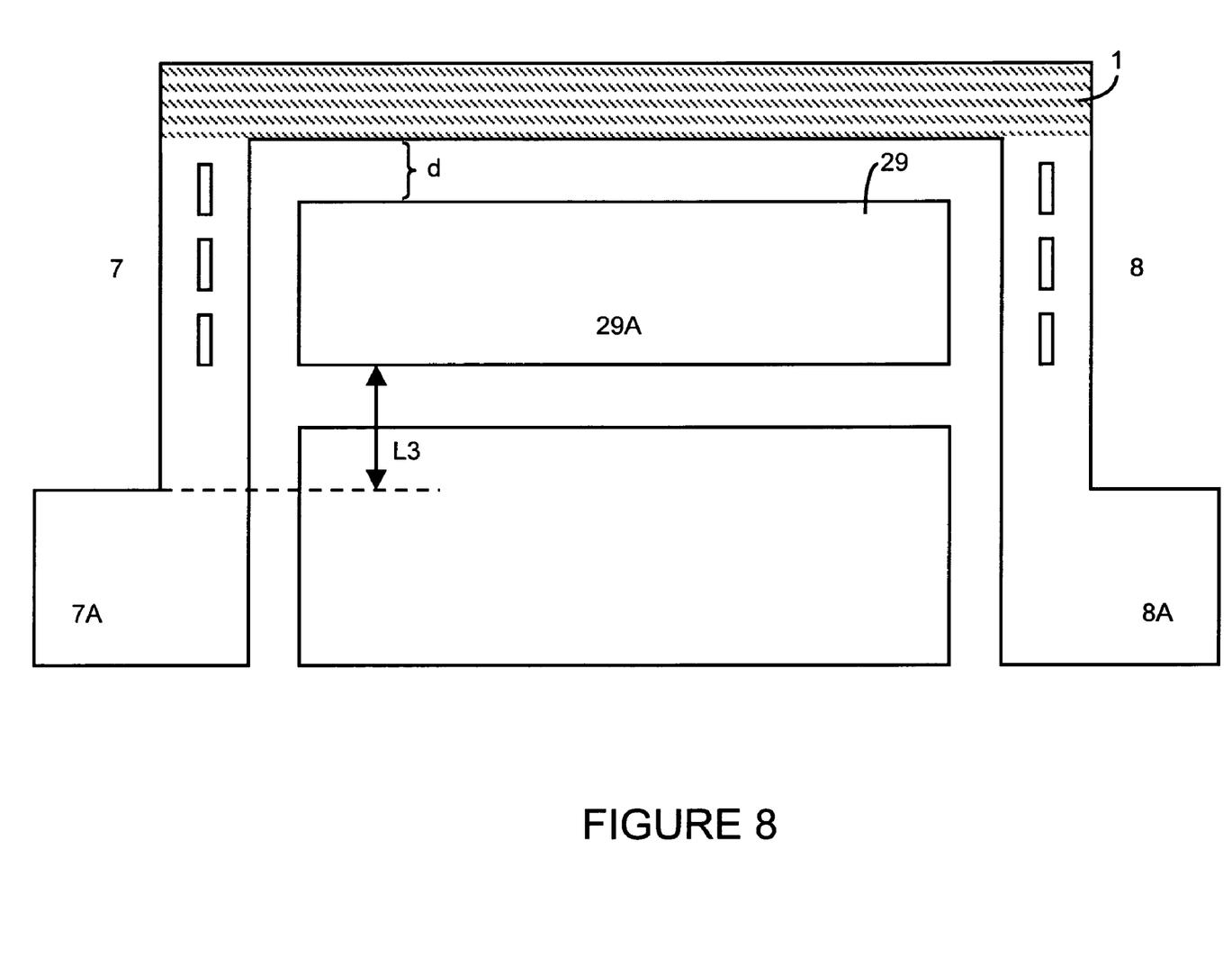
FIGS. 8 and 9A-C illustrate the use of laterally disposed and composite anchors within yet other aspects of the present invention.

Relative anchor locations on a substrate may also be used to adjust a separation gap between an electrode and beam. This result may be achieved by considering during the design process the different thermal expansion coefficients between the substrate and one or more active layer(s) deposited on the substrate. This approach is illustrated in FIG. 8.

Here, an electrode 29 is separated from beam 1 across a working gap. Electrode 29 is fixed to the substrate at anchor 29A. In contrast, supports 7 and 8 fix beam 1 to the substrate at respective anchors 7A and 8A. Assuming, as examples, that the substrate is silicon of sapphire (SOS) and the active layer is EpiPoly, the lateral distance L3 between the respective anchors, as measured in the direction of thermal expansion for the beam, will adjust the working gap over a range of operating temperatures.

Figure 9A:
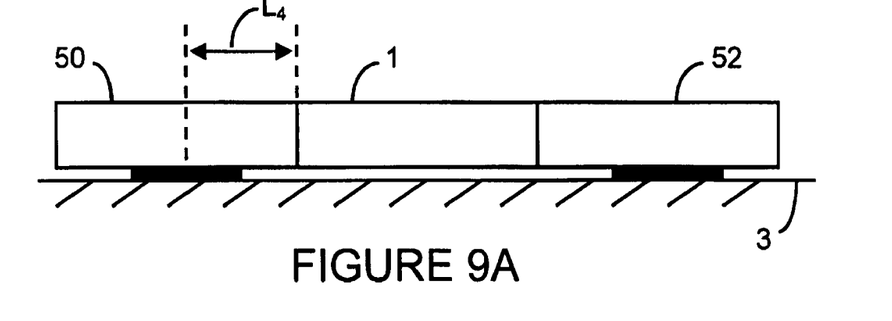
Figure 9B:
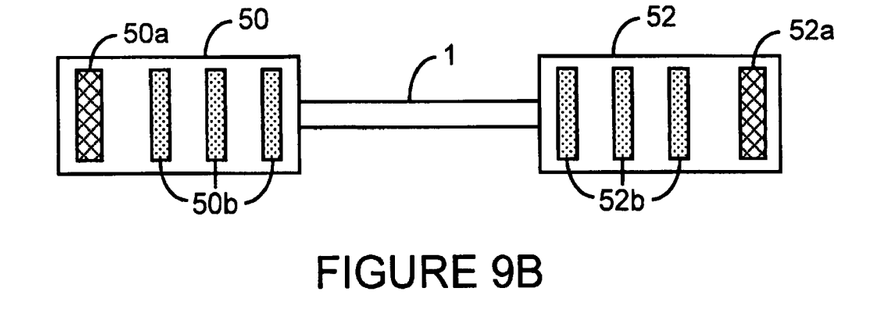

Relative anchor composition may also be used to effect thermal compensation for resonance beam frequency variations. Recognizing that compressive strain tends to decrease the resonant frequency of a beam and tensile strain tends to increase the resonant frequency, anchors having a thermal expansion coefficient different from the substrate may be used to induce a compressive or tensile strain on the beam. This approach is illustrated in FIGS. 9A and 9B.

Here, a bending (or suspended) beam 1 is supported over substrate 3 by anchors 50 and 52. By forming anchors from two or more materials having in combination a different thermal expansion coefficient from that of the substrate, a compressive or tensile strain may be exerted on beam 1. As above, substrate 3 may be formed from many conventional materials including, without limitation, silicon and germanium.

Anchors 50 and 52 are respectively fixed to substrate 3 at anchor points 50A and 52A. The composite anchors may be formed, for example, by $SiO_2$ re-fill into selectively vacated portions of an EpiPoly anchor body. This would result in composite anchors 50 and 52 having a lower overall thermal expansion coefficient with respect to an EpiPoly beam and/or a silicon-based substrate. The length of the composite anchors, L4, as measured between an anchor point and the beam, provides leverage for the compressive or tensile strain applied to beam 1 by the disparate thermal expansion of the selected materials.

The relative beam composition may also be used to effect thermal compensation for resonance beam frequency variations. In this regard, with reference to FIGS. 9C and 9D, beam 1 may be comprised of a plurality of materials 1a and 1b (for example, silicon, germanium, silicon oxide and/or silicon nitride) that have different thermal expansion coefficients of expansion. For example, beam 1 may be comprised of an inner-core of silicon and an outer-layer of silicon oxide. Alternatively, beam 1 may be comprised of silicon, germanium and silicon dioxide (1a, 1b, 1c, respectively —see, FIG. 9E). Indeed, any of the materials discussed herein (or other materials) may be employed to comprise beam 1.

Figure 9C:
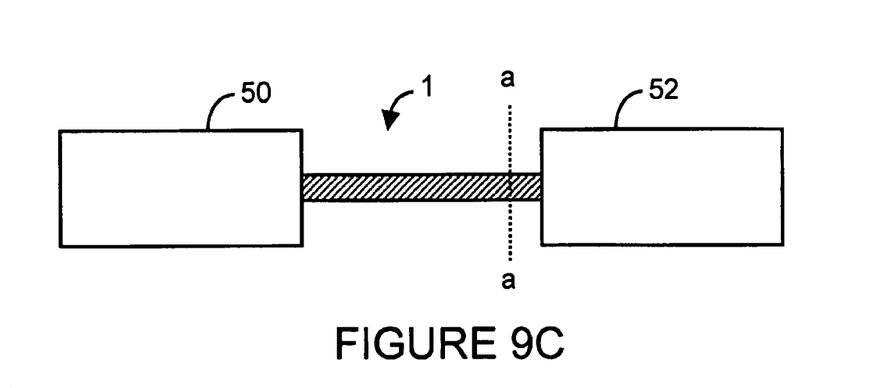
Figure 9D:
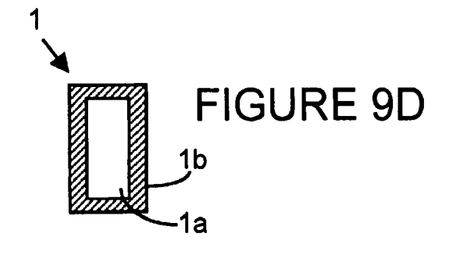
FIGS. 9D and 9E illustrate cross-sectional views of the embodiment of FIG. 9C, sectioned along dotted line a-a.
Figure 9E:
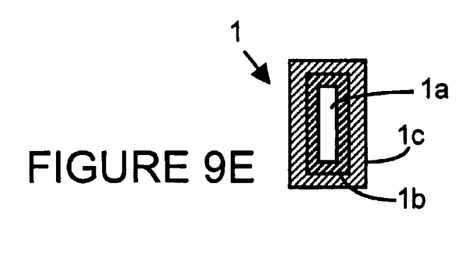

The invention illustrated in FIG. 9C may also be incorporated with the inventions illustrated in FIGS. 9A and 9B. In this regard, beam 1 may be comprised of a plurality of materials, each having different thermal coefficients of expansion and anchors 50 and/or 52 are/is comprised of two or more materials having in combination a different thermal expansion coefficient from that of the substrate.

Figure 10:
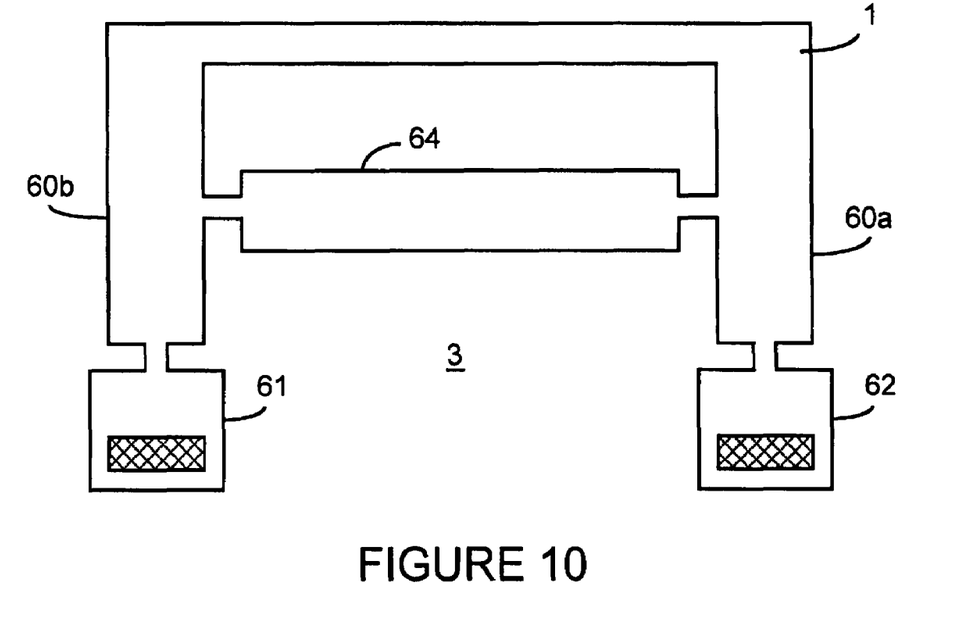
FIG. 10 illustrates a micromechanical resonator adapted to apply compressive or tensile strain upon a beam structure according to still another aspect of the present invention.

Composite anchors 61 and 62 are combined in FIG. 10 with lever arms 60A and 60B and compressive/expansion bar 64 to exert a tensile or compressive force on resonant beam 1. That is, by selecting composition materials having disparate thermal expansion coefficients for anchors 61 and 62, compression/expansion bar 64, beam 1, and/or substrate 3, an appropriate compressive or tensile strain may be applied to beam 1 in order to compensate for temperature induced frequency variations.

Throughout the foregoing disclosure, selected bending beam or lateral oscillating beam structures have been used as examples. However, the frequency compensation schemes thus illustrated are not limited to the exemplary structures, but have application to all beams useful in MEMs. Further, various materials have been suggested for composition of the exemplary components. Again, these are merely presently preferred examples. So, long as resonator components are properly designed and fabricated with materials having sufficiently disparate thermal expansion coefficients, the passive and/or active frequency compensation solutions taught herein may be achieved.

Figure 11:
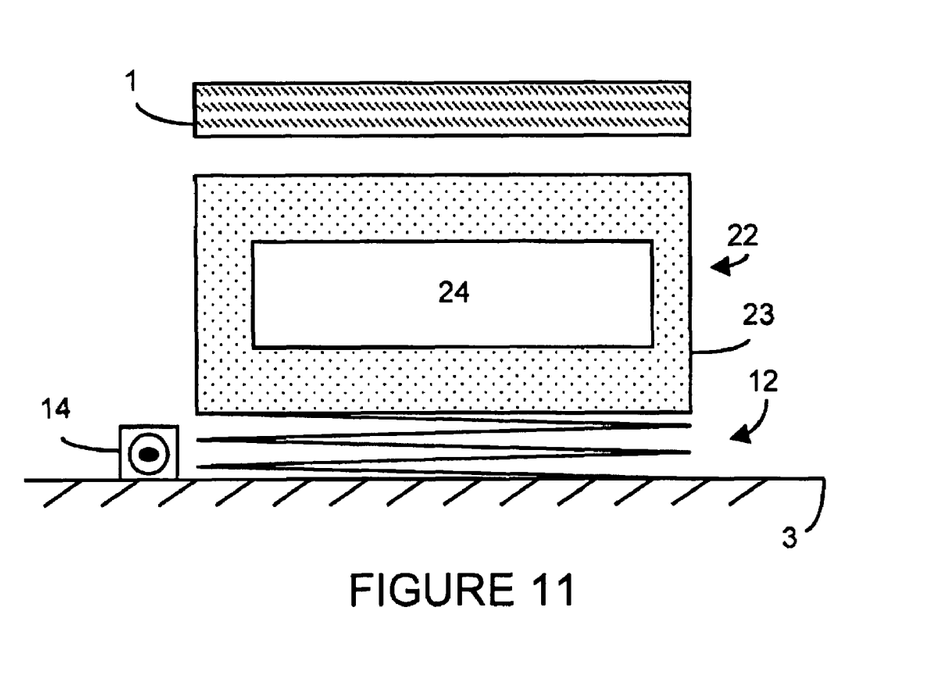
FIG. 11 illustrates exemplary embodiment of the present invention including passive and active compensation techniques of FIGS. 3 and 4B.

Moreover, the passive techniques and active techniques described and illustrated herein may also be combined or integrated to provide a solution that employs both passive and active compensation techniques. For example, the embodiments of FIG. 3 and FIG. 4A and/or 4B may be integrated to provide both a passive and active approach (see, for example, FIG. 11).

Throughout this application the term "compensation" and "compensate" (or similar terms) are used to denote a remedial process by which a major component or factor of the conditions adversely influencing resonator stability is addressed and/or ameliorated. Other issues, and even issues relating to thermal expansion, such as changes in geometries (for example, height and/or width) may be less significant in the overall impact on the compensation. Moreover, the approach herein may be well suited to address, compensate for, and/or ameliorate conditions adversely influencing resonator stability over a finite range of temperature variations (for example, a predetermined temperature range).

What is claimed is:

1. A microelectromechanical device, comprising:
   a substrate:
   an electrode fixed to the substrate;
   a moveable beam formed from a plurality of materials, wherein the moveable beam includes:
   (i) an inner-core of a first material, and
   (ii) an outer-layer, surrounding the inner-core, comprising a second material,
   wherein the second material is different from the first material; and
   an anchor, fixed to the substrate and coupled to the moveable beam, to, at least in part, support the moveable beam above the substrate;
   wherein the inner-core of the moveable beam is silicon and the outer-layer of the moveable beam is a silicon oxide.

2. A microelectromechanical device of claim 1 wherein the outer-layer is disposed on the inner-core.

3. A microelectromechanical device, comprising:
   a substrate;
   a moveable beam formed from a plurality of materials, wherein the moveable beam includes:
   (i) a first inner-core comprising a first material,
   (ii) a second inner-core, disposed around the first inner-core, comprising a second material, wherein the second material is different from the first material, and
   (iii) an outer-layer, disposed around the second inner-core, comprising a third material, wherein the third material is different from the second material; and
   an anchor, disposed on the substrate and coupled to the moveable beam, to, at least in part, support the moveable beam above the substrate;
   wherein the outer-layer of the moveable beam includes silicon, germanium, a silicon oxide or a silicon nitride.

4. The microelectromechanical device of claim 3, wherein the first inner-core of the moveable beam includes silicon, germanium, a silicon oxide or a silicon nitride.

5. A microelectromechanical device, comprising:
   a substrate;
   a moveable beam formed from a plurality of materials, wherein the moveable beam includes:
   (i) a first inner-core comprising a first material,
   (ii) a second inner-core, disposed around the first inner-core, comprising a second material, wherein the second material is different from the first material, and
   (iii) an outer-layer, disposed around the second inner-core, comprising a third material, wherein the third material is different from the second material; and an anchor, disposed on the substrate and coupled to the moveable beam, to, at least in part, support the moveable beam above the substrate;

wherein (i) the first inner-core is silicon and (ii) the second inner-core or the outer-layer is a silicon oxide.

6. A microelectromechanical device, comprising:

a substrate;

a moveable beam formed from a plurality of materials, wherein the moveable beam includes:
  (i) a first inner-core comprising a first material,
  (ii) a second inner-core, disposed around the first inner-core, comprising a second material, wherein the second material is different from the first material, and
  (iii) an outer-layer, disposed around the second inner-core, comprising a third material, wherein the third material is different from the second material; and an anchor, disposed on the substrate and coupled to the moveable beam, to, at least in part, support the moveable beam above the substrate;

wherein the first inner-core of the moveable beam is silicon, the second inner-core of the moveable beam is germanium, and the outer-layer of the moveable beam is a silicon oxide.

7. A microelectromechanical device, comprising:

a substrate;

a moveable beam formed from a plurality of materials, including:
  (i) a first inner-core of a first material, and
  (ii) an outer-layer, surrounding the first inner-core, comprising a second material, wherein the second material is different from the first material; and an anchor, disposed on the substrate and coupled to the moveable beam, to, at least in part, support the moveable beam above the substrate, wherein the anchor is formed from at least one material which provides a thermal expansion coefficient which is different from a thermal expansion coefficient of the moveable beam;

wherein the first inner-core of the moveable beam is silicon and the outer-layer of the moveable beam is a silicon oxide.

8. The microelectromechanical device of claim 7 wherein the anchor is formed from at least two different materials.

9. The microelectromechanical device of claim 7 wherein the anchor is formed from at least three different materials.

10. The microelectromechanical device of claim 7 wherein the moveable beam further includes a second inner-core which is disposed around the first inner-core, wherein the second inner-core comprises a third material, wherein the third material is different from the first material or the second material.

11. A microelectromechanical device, comprising:

a substrate;

a moveable beam formed from a plurality of materials, including:
  (i) a first inner-core of a first material,
  (ii) an outer-layer, surrounding the first inner-core, comprising a second material, wherein the second material is different from the first material, and
  (iii) a second inner-core disposed around the first inner-core, comprising a third material, wherein the third material is different from the first material or the second material; and an anchor, disposed on the substrate and coupled to the moveable beam, to, at least in part, support the moveable beam above the substrate, wherein the anchor is formed from at least one material which provides a thermal expansion coefficient which is different from a thermal expansion coefficient of the moveable beam;

wherein the first inner-core of the moveable beam includes silicon, germanium, a silicon oxide or a silicon nitride; and wherein the outer-layer of the moveable beam includes silicon, germanium, a silicon oxide or a silicon nitride.

12. A microelectromechanical device, comprising:

a substrate;

a moveable beam formed from a plurality of materials, including:
  (i) a first inner-core of a first material,
  (ii) an outer-layer, surrounding the first inner-core, comprising a second material, wherein the second material is different from the first material, and
  (iii) a second inner-core disposed around the first inner-core, comprising a third material, wherein the third material is different from the first material or the second material; and an anchor, disposed on the substrate and coupled to the moveable beam, to, at least in part, support the moveable beam above the substrate, wherein the anchor is formed from at least one material which provides a thermal expansion coefficient which is different from a thermal expansion coefficient of the moveable beam;

wherein the first inner-core of the moveable beam is silicon and the outer-layer of the moveable beam is a silicon oxide.

13. A microelectromechanical device, comprising:

a substrate;

a moveable beam formed from a plurality of materials, including:
  (i) a first inner-core of a first material,
  (ii) an outer-layer, surrounding the first inner-core, comprising a second material, wherein the second material is different from the first material, and
  (iii) a second inner-core disposed around the first inner-core, comprising a third material, wherein the third material is different from the first material or the second material; and an anchor, disposed on the substrate and coupled to the moveable beam, to, at least in part, support the moveable beam above the substrate, wherein the anchor is formed from at least one material which provides a thermal expansion coefficient which is different from a thermal expansion coefficient of the moveable beam;

wherein the first inner-core of the moveable beam is silicon, the second inner-core of the moveable beam is germanium, and the outer-layer of the moveable beam is a silicon oxide.

14. A microelectromechanical device, comprising:

a substrate;

a moveable beam formed from a plurality of materials, including:
  (i) a first inner-core of a first material,
  (ii) an outer-layer, surrounding the first inner-core, comprising a second material, wherein the second material is different from the first material, and
  (iii) a second inner-core disposed around the first inner-core, comprising a third material, wherein the third material is different from the first material or the second material; and an anchor, disposed on the substrate and coupled to the moveable beam, to, at least in part, support the moveable beam above the substrate, wherein the anchor is formed from at least one material which provides a thermal expansion coefficient which is different from a thermal expansion coefficient of the moveable beam;

wherein the anchor is formed from at least two different materials.

15. A microelectromechanical device, comprising:

a substrate;

a moveable beam formed from a plurality of materials, including:
- (i) a first inner-core of a first material,
- (ii) an outer-layer, surrounding the first inner-core, comprising a second material, wherein the second material is different from the first material, and
- (iii) a second inner-core disposed around the first inner-core, comprising a third material, wherein the third material is different from the first material or the second material; and an anchor, disposed on the substrate and coupled to the moveable beam, to, at least in part, support the moveable beam above the substrate, wherein the anchor is formed from at least one material which provides a thermal expansion coefficient which is different from a thermal expansion coefficient of the moveable beam;

wherein the anchor is formed from at least three different materials.

* * * * *